(12) United States Patent
Kim et al.

(10) Patent No.: US 8,873,245 B2
(45) Date of Patent: Oct. 28, 2014

(54) EMBEDDED CHIP-ON-CHIP PACKAGE AND PACKAGE-ON-PACKAGE COMPRISING SAME

(75) Inventors: Yong-hoon Kim, Suwon-si (KR); Hee-seok Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 596 days.

(21) Appl. No.: 13/113,239

(22) Filed: May 23, 2011

(65) Prior Publication Data

US 2011/0317381 A1     Dec. 29, 2011

(30) Foreign Application Priority Data

Jun. 29, 2010   (KR) ........................ 10-2010-0062080

(51) Int. Cl.
  *H05K 1/18*      (2006.01)
  *H01L 25/10*     (2006.01)
  *H01L 25/065*    (2006.01)
  *H05K 3/34*      (2006.01)
  *H05K 3/28*      (2006.01)

(52) U.S. Cl.
  CPC ...... *H05K 1/183* (2013.01); *H01L 2224/48227* (2013.01); *H01L 2924/15311* (2013.01); *H01L 2224/73265* (2013.01); *H01L 25/105* (2013.01); *H01L 2225/06541* (2013.01); *H05K 3/3436* (2013.01); *H01L 2224/32225* (2013.01); *H01L 25/0657* (2013.01); *H01L 2225/1023* (2013.01); *H01L 2225/06565* (2013.01); *H05K 2201/10515* (2013.01); *H05K 3/284* (2013.01); *H01L 2225/1058* (2013.01); *H01L 2224/16227* (2013.01); *H01L 2924/15153* (2013.01); *H01L 2924/15331* (2013.01); *H05K 2201/1053* (2013.01); *H01L 2224/16145* (2013.01)

USPC .......... 361/761; 361/763; 361/766; 361/784; 361/790

(58) Field of Classification Search
  USPC ......... 361/763–766, 782–784, 792–795, 790; 257/685–686
  See application file for complete search history.

(56) References Cited

U.S. PATENT DOCUMENTS

| | | | |
|---|---|---|---|
| 6,787,869 B1* | 9/2004 | Vittu | 257/434 |
| 7,042,077 B2* | 5/2006 | Walk et al. | 257/686 |
| 7,335,531 B2* | 2/2008 | Iijima et al. | 438/106 |
| 7,863,735 B1* | 1/2011 | Cho et al. | 257/723 |
| 8,349,649 B2* | 1/2013 | Kurita | 438/107 |
| 2005/0211465 A1* | 9/2005 | Sunohara et al. | 174/260 |
| 2006/0063312 A1* | 3/2006 | Kurita | 438/127 |
| 2007/0285907 A1* | 12/2007 | Nishikawa et al. | 361/763 |
| 2008/0151516 A1* | 6/2008 | Suzuki et al. | 361/761 |
| 2009/0051024 A1* | 2/2009 | Chia | 257/686 |
| 2009/0290317 A1* | 11/2009 | Mashino | 361/782 |

FOREIGN PATENT DOCUMENTS

| JP | 11214611 A | 8/1999 |
|---|---|---|
| JP | 2000349225 | 12/2000 |
| KR | 1020100002711 A | 1/2010 |

* cited by examiner

*Primary Examiner* — Tuan T Dinh
(74) *Attorney, Agent, or Firm* — Volentine & Whitt, PLLC

(57) ABSTRACT

An embedded chip-on-chip package includes a printed circuit board having a recessed semiconductor chip mounting unit constituted by a recess in the printed circuit board and a circuit pattern at the bottom of the recess, a first semiconductor chip embedded in the recessed semiconductor chip mounting unit and electrically connected to the circuit pattern at the bottom of the recess, and a second semiconductor chip mounted to the recessed semiconductor chip mounting unit and electrically connected to the first semiconductor chip and the printed circuit board independently of each other.

8 Claims, 8 Drawing Sheets

EMBEDDED CHIP-ON-CHIP PACKAGE AND PACKAGE-ON-PACKAGE COMPRISING SAME

CROSS-REFERENCE TO RELATED APPLICATIONS

This application claims priority under 35 U.S.C. §119 to Korean Patent Application No. 10-2010-0062080 filed on Jun. 29, 2010, the disclosure of which is hereby incorporated by reference in its entirety.

BACKGROUND OF THE INVENTION

Embodiments of the inventive concept relate generally to integrated circuit packaging. More particularly, embodiments of the inventive concept relate to a chip-on-chip (COC) semiconductor package comprising one or more semiconductor chips, and a package-on-package (POP) incorporating the COC semiconductor package.

In response to increasing demand for electronic data processing capability, researchers are continually striving to improve the performance and functionality of semiconductor devices. One way to increase performance is by increasing the integration density of the devices through improved wafer manufacturing processes. Another way to increase performance is by reducing the footprint of the devices and enhancing connectivity through improved packaging techniques.

In general, improvements in wafer manufacturing processes tend to be more expensive than improvements in packaging techniques. Accordingly, a significant amount of research has been devoted to improving integrated circuit packages such as systems-in-package (SIPs), multi-chip packages (MCPs), and POPs.

An SIP is a multi-chip construction in which one semiconductor package incorporates system components such as a microprocessor, a logic device, and a memory device. The SIP can reduce the size of a system by efficiently arranging the components within a single package instead of separately arranging them on a printed circuit board (PCB). One way to arrange the components in a single package is a COC configuration in which different semiconductor chips are stacked on each other and connected together in conjunction with the stacking.

SUMMARY OF THE INVENTION

According to one embodiment of the inventive concept, an embedded COC package comprises a PCB having a recessed semiconductor chip mounting unit, a first semiconductor chip embedded in the recessed semiconductor chip mounting unit, and a second semiconductor chip mounted on the first semiconductor chip and the PCB.

According to another embodiment of the inventive concept, an embedded COC package comprises a PCB having a recessed semiconductor chip mounting unit, a first semiconductor chip embedded in the recessed semiconductor chip mounting unit, a second semiconductor chip mounted on the first semiconductor chip and the PCB, and a third semiconductor chip having a smaller size than the second semiconductor chip and mounted on the second semiconductor chip using bumps.

According to yet another embodiment of the inventive concept, a POP comprises an embedded COC package comprising a PCB having a recessed semiconductor chip mounting unit, a first semiconductor chip embedded in the recessed semiconductor chip mounting unit, and a second semiconductor chip mounted on the first semiconductor chip and the PCB, and an additional semiconductor package mounted on the PCB of the embedded COC package using solder balls.

These and other embodiments of the inventive concept can provide COC packages and POPs with reduced size and improved internal connections.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the attached drawings. These embodiments are presented as teaching examples and should not be construed to limit the scope of the inventive concept.

Figure 1:
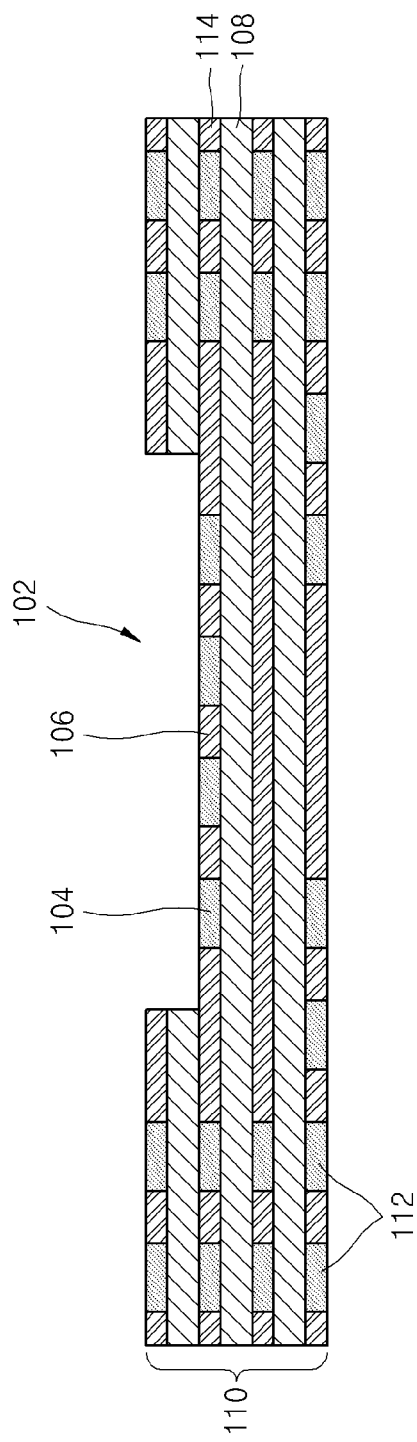
FIGS. 1 through 3 are cross-sectional views illustrating a method of manufacturing an embedded COC package according to an embodiment of the inventive concept.
Figure 2:
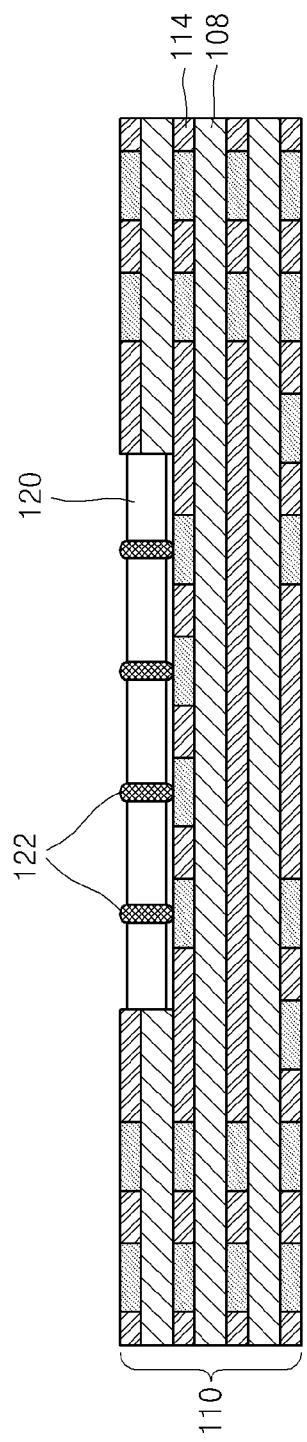
Figure 3:
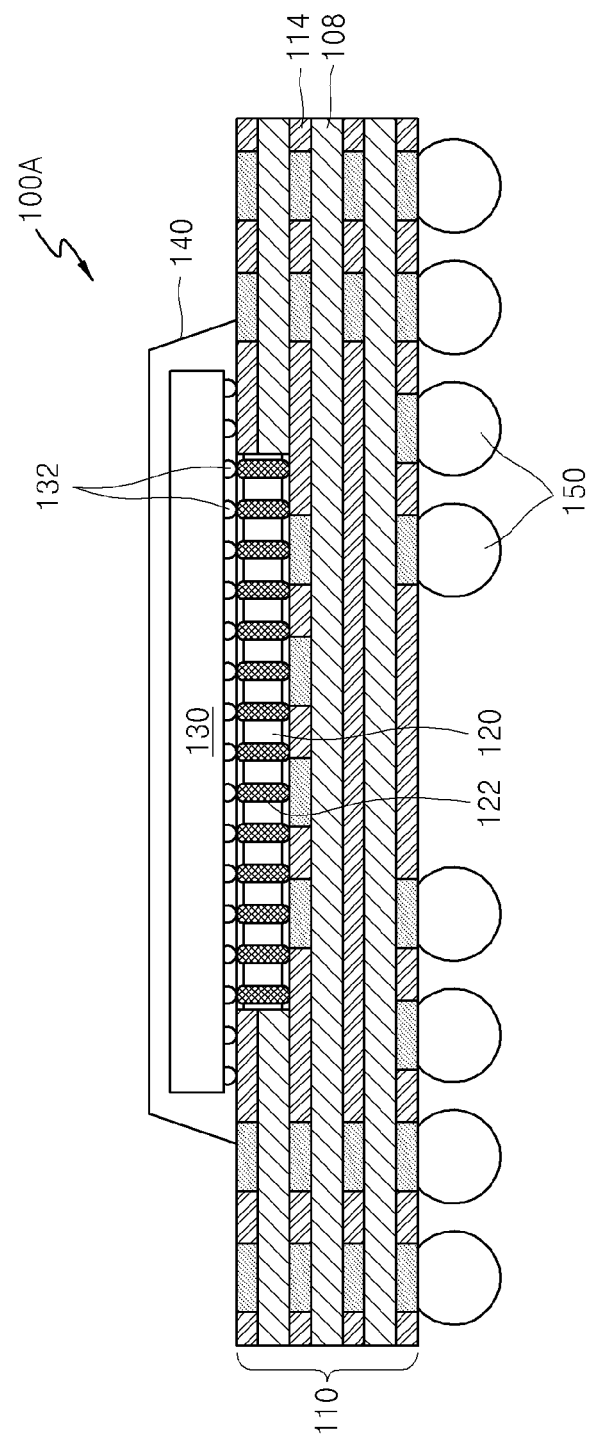

FIGS. 1 through 3 are cross-sectional views illustrating a method of manufacturing an embedded COC package 100A according to an embodiment of the inventive concept.

Referring to FIG. 1, a PCB 110 having a multilayer substrate structure is prepared. PCB 110 comprises insulating layers 108 alternately formed with layers 114 having printed circuit patterns 104. PCB 110 comprises a recessed semiconductor chip mounting unit 102 configured to receive a semiconductor chip. Printed circuit patterns 104 and an insulating material 106 that are connectable to pads of the semiconductor chip are formed on a bottom surface of recessed semiconductor chip mounting unit 102.

In some embodiments, PCB 110 comprises bond fingers (not shown) on an upper surface and solder ball pads 112 on a lower surface. The bond can be connected to bond pads of a semiconductor chip, and the solder balls can be connected to other solder balls or other electrical contacts.

Referring to FIG. 2, a first semiconductor chip 120 is embedded in recessed semiconductor chip mounting unit 102. First semiconductor chip 120 typically comprises a memory device and can be formed with a small thickness by grinding a bottom surface thereof. First semiconductor chip 120 is embedded in PCB 110 such that an active surface of first semiconductor chip 120 on which a circuit region is formed faces upward.

First semiconductor chip 120 comprises bond pads for signal lines, bond pads for power lines, and bond pads for ground lines. Through silicon vias (TSVs) 122 are formed in first semiconductor chip 120 to correspond to the bond pads for power lines and the bond pads for ground lines. TSVs 122 are electrically connected to printed circuit pattern 104 formed on the bottom surface of recessed semiconductor chip mounting unit 102.

An internal filling material and a protruding structure of TSVs 122 can be changed in various alternative embodiments. Also, TSVs 122 can be connected to printed circuit pattern 104 directly as illustrated in FIG. 2 or by additionally using an anisotropic conductive film (ACF).

Referring to FIG. 3, a second semiconductor chip 130 is mounted on the structure shown in FIG. 2. Semiconductor chip 130 comprises bond pads connected to bumps 132 and is mounted so that an active surface of second semiconductor chip 130 on which a circuit region is formed faces downward. Second semiconductor chip 130 has a greater size than first semiconductor chip 120, and can perform functions of a controller or a microprocessor.

Second semiconductor chip 130 comprises bond pads for signal connection, bond pads for power terminals, and bond pads for ground terminals. Bumps 132 are formed on bond pads for signal connection. These bumps 132 are electrically connected to bond fingers (not shown) formed on the upper surface of PCB 110. Bumps 132 are also formed on bond pads for power terminals and bond pads for ground terminals. These bumps 132 are connected to TSVs 122 formed in first semiconductor chip 120.

Where necessary, some bond pads for signal connection are connected to TSVs 122 and then connected to printed circuit pattern 104 formed on the bottom surface of recessed semiconductor chip mounting unit 102.

An encapsulation resin 140 is formed to seal first and second semiconductor chips 120 and 130 and the upper surface of PCB 110. Solder balls 150 are bonded to solder ball pads 112 formed on the lower surface of PCB 110. Before encapsulation resin 140 is formed, an underfill can be avoided by placing epoxy in a gap between second semiconductor chip 130 and PCB 110. Also, instead of the solder balls 150, a thin solder layer can be formed and external connection terminals may be formed in a land type so as to reduce an overall height of embedded COC package 100A.

Figure 6:
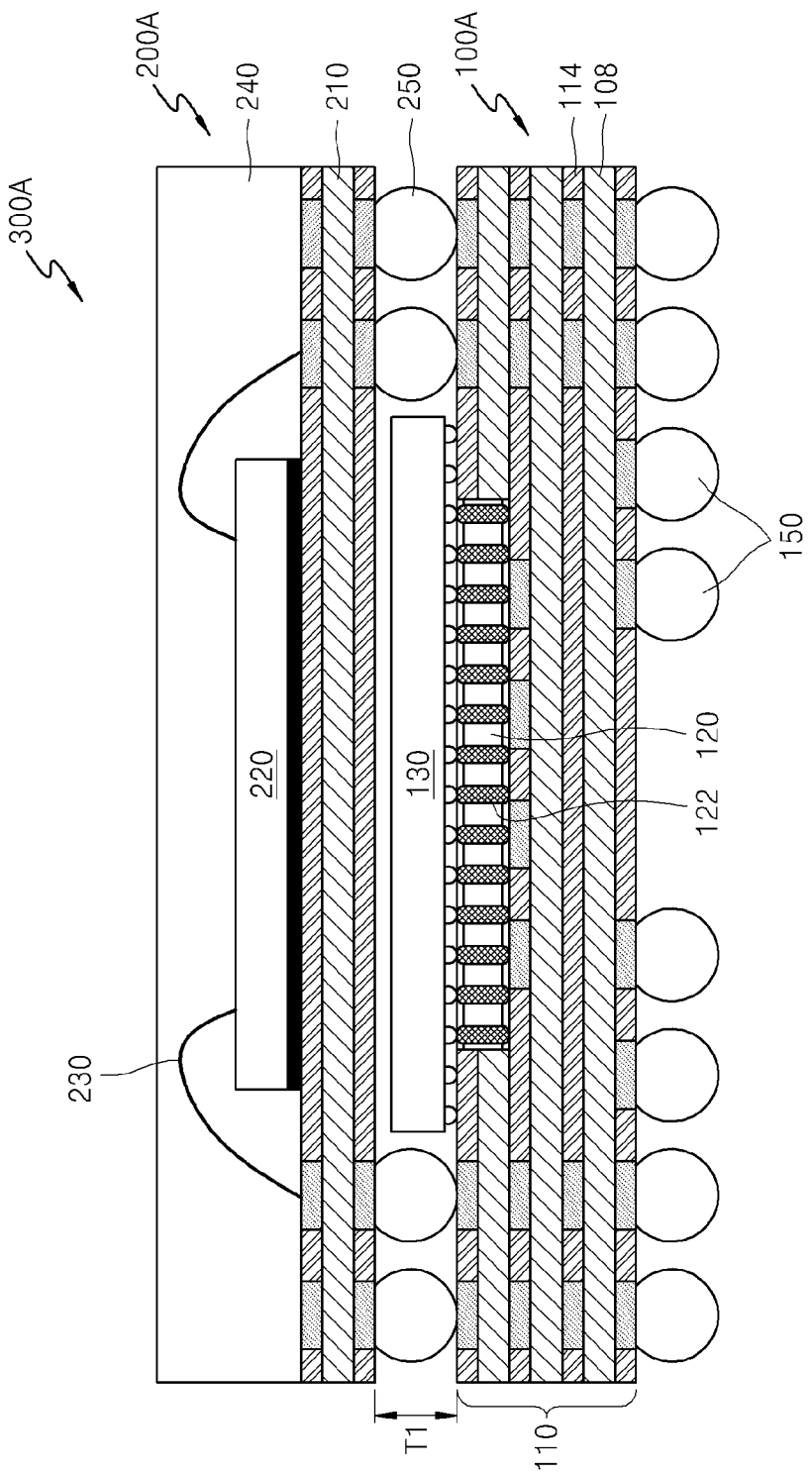
FIGS. 6 through 8 are cross-sectional views of POPs comprising embedded COC packages and other semiconductor packages according to embodiments of the inventive concept.
Figure 7:
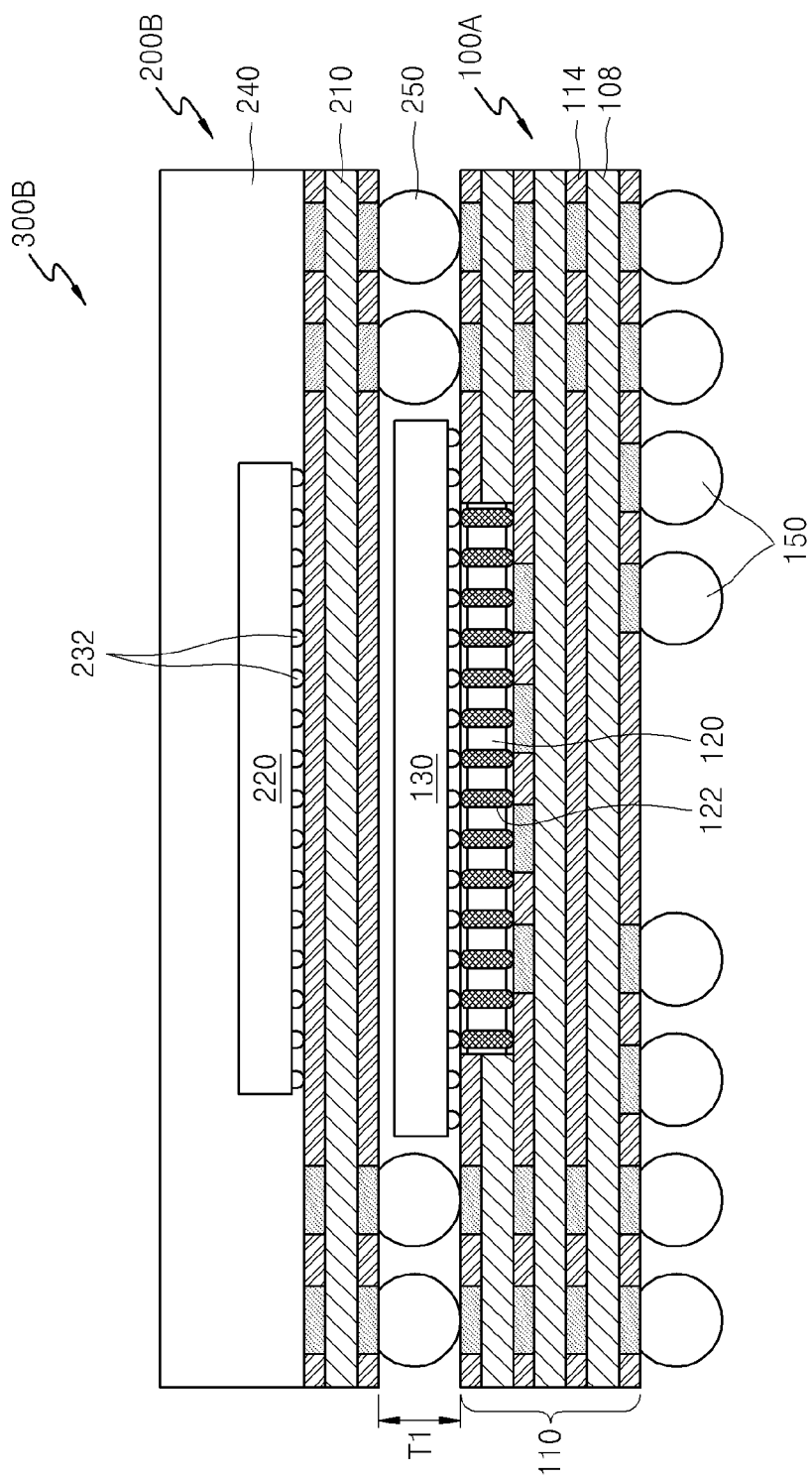
Figure 8:
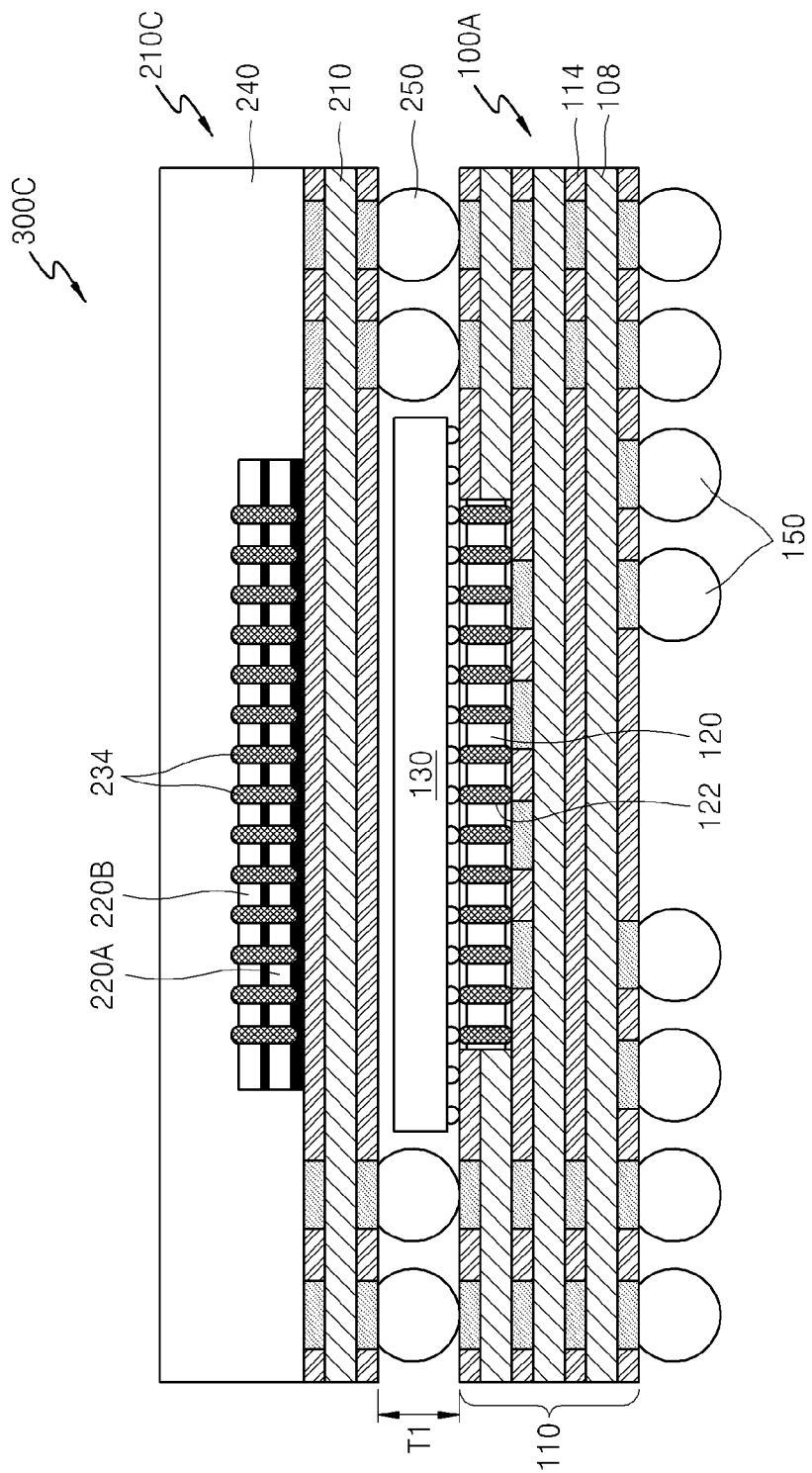

Embedded COC package 100A comprises first and second semiconductor chips 120 and 130 and first semiconductor chip 120 is embedded in PCB 110. With this configuration, the overall height of embedded COC package 100A can be reduced. Embedded COC package 100A can be used to form integrated semiconductor packages having a POP structure as illustrated in FIGS. 6 through 8. Embedded COC package 100A can be used to reduce the size of mobile phones and electronic devices when mounted therein.

Due to bumps 132 connected to bond pads for power terminals and bond pads for ground terminals, a power signal is transmitted along a relatively short path via bond fingers on the upper surface of PCB 110 and is transmitted along a relatively short path via TSVs 122 formed in first semiconductor chip 120. These relatively short paths for transmitting the power signal can improve the power signal transmission characteristics of embedded COC package 100A and power integrity characteristics of embedded COC package 100A.

In addition, additional bond fingers for power terminals and bond fingers for ground terminals on the upper surface of PCB 110 can be replaced by bond pads for input/output (I/O) terminal connection, i.e., bond pads for signal connection. Accordingly, first semiconductor chip 120 can be used as a wide I/O memory. As a result, where a power signal is transmitted to PCB 110 along a short path via TSVs 122 as described above, the operating speed of embedded COC package 100A tends to increase.

Figure 4:
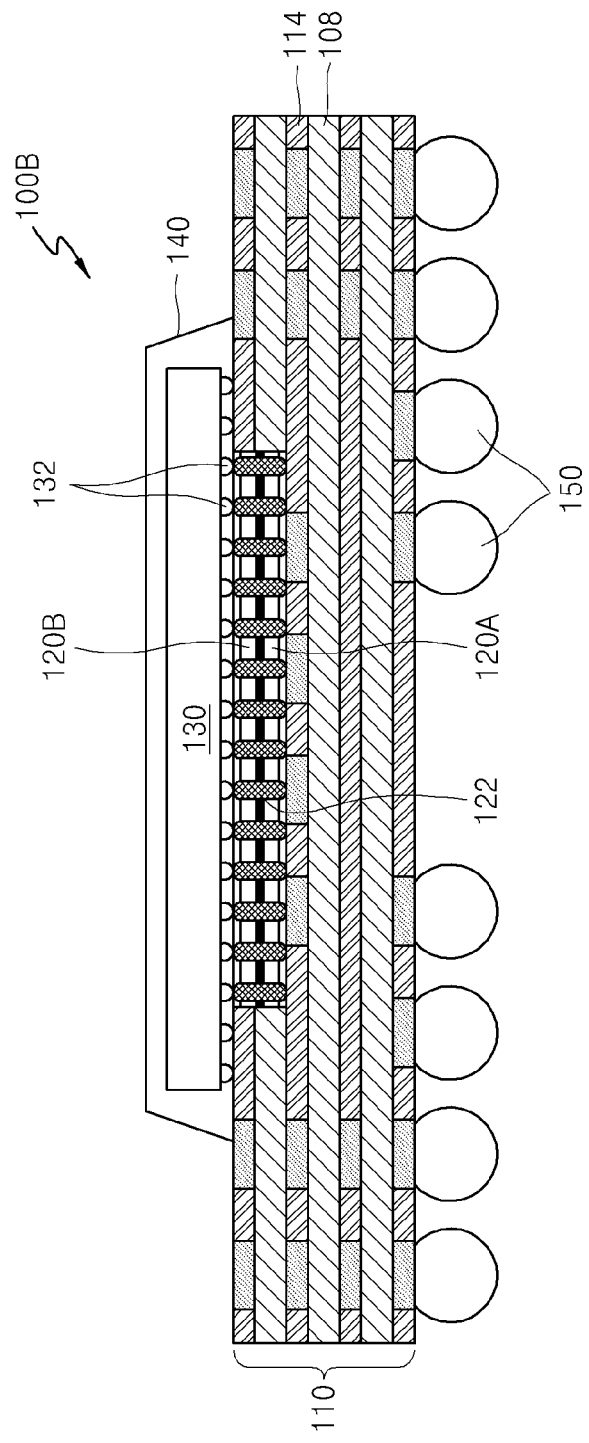
FIG. 4 is a cross-sectional view of an embedded COC package according to another embodiment of the inventive concept.

FIG. 4 is a cross-sectional view of an embedded COC package 100B according to an embodiment of the inventive concept. COC package 100B is a variation of COC package 100A illustrated in FIG. 3.

Referring to FIG. 4, COC package 100B differs from COC package 100A in that two first semiconductor chips 120A and 120B are stacked on one another instead of one. First semiconductor chips 120A and 120B can be the same memory semiconductor chips. TSVs 122 are formed to penetrate through first semiconductor chips 120A and 120B and to correspond to bond pads for power terminals and bond pads for ground terminals on first semiconductor chips 120A and 120B. Other features of embedded COC package 100B are the same as those of embedded COC package 100A, so a further description thereof will not omitted.

Figure 5:
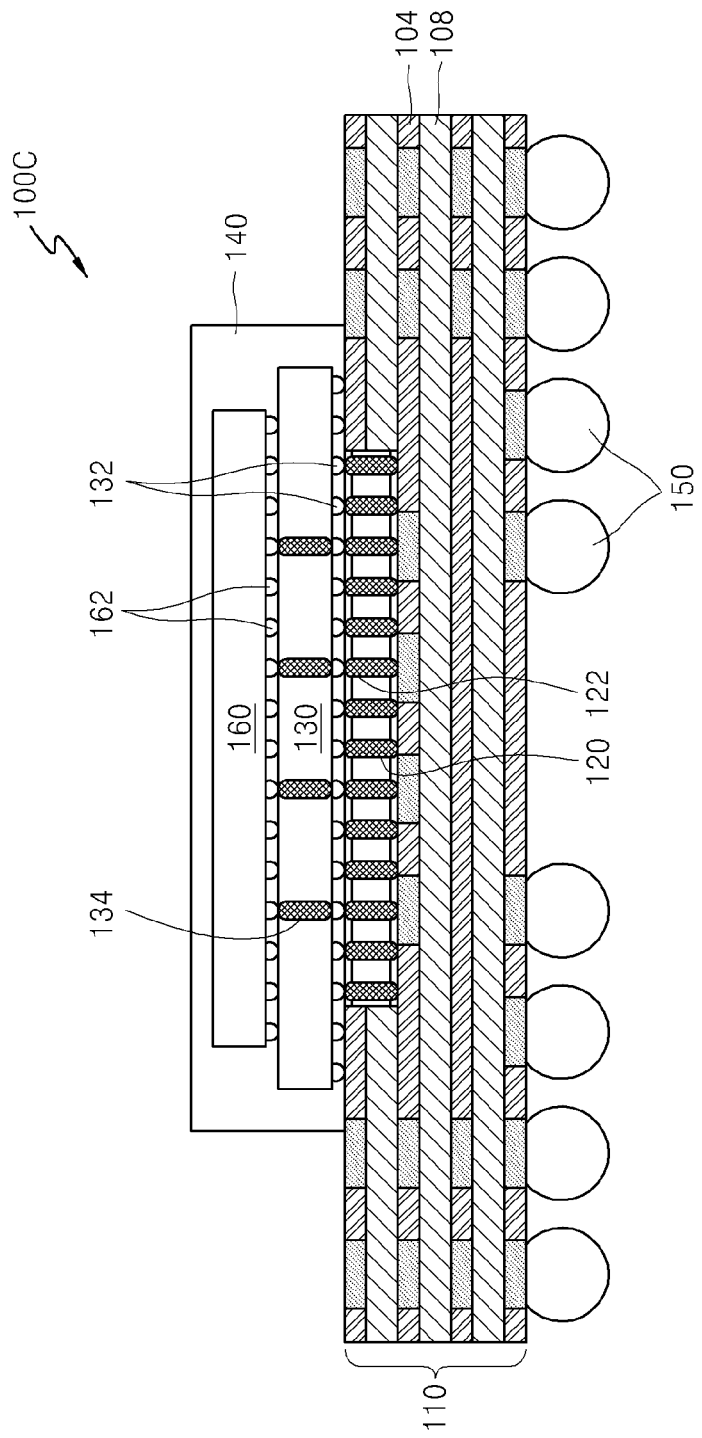
FIG. 5 is a cross-sectional view of an embedded COC package according to yet another embodiment of the inventive concept.

FIG. 5 is a cross-sectional view of an embedded COC package 100C according to another embodiment of the inventive concept.

Referring to FIG. 5, embedded COC package 100C comprises PCB 110 comprising recessed semiconductor chip mounting unit 102, first semiconductor chip 120 embedded in recessed semiconductor chip mounting unit 102, second semiconductor chip 130 mounted on first semiconductor chip 120 and PCB 110, and a third semiconductor chip 160 having a smaller size than second semiconductor chip 130 and mounted on second semiconductor chip 130 by bumps 162.

Embedded COC package 100C further comprises encapsulation resin 140 sealing first through third semiconductor chips 120, 130, and 160 and the upper surface of PCB 110, and solder balls 150 bonded to the lower surface of PCB 110.

Except for third semiconductor chip 160, the structure of embedded COC package 100C is substantially the same as that of embedded COC package 100A illustrated in FIG. 3. To connect third semiconductor chip 160, TSVs 134 are additionally formed in second semiconductor chip 130. Third semiconductor chip 160 is mounted on and electrically connected to second semiconductor chip 130 via bumps 162. Bumps 162 of third semiconductor chip 160 are separately and electrically connected to TSVs 134 formed in second semiconductor chip 130. TSVs 134 are formed to correspond to bond pads for power terminals or bond pads for ground terminals. However, where necessary, TSVs 134 can also be formed to correspond to some bond pads for signal connection.

FIGS. 6 through 8 are cross-sectional views of POPs 300A through 300C comprising embedded COC package 100A illustrated in FIG. 3 and additional semiconductor packages 200A through 200C, respectively, according to embodiments of the inventive concept.

Referring to FIG. 6, POP 300A comprises embedded COC package 100A and semiconductor package 200A mounted on embedded COC package 100A using solder balls 250. Although not shown in FIG. 6, POP 300A can further comprise an encapsulation resin sealing second semiconductor chip 130 on embedded COC package 100A, and a portion of the upper surface of PCB 110.

A height T1 of solder balls 250 of semiconductor package 200A is less than twice the thickness of second semiconductor chip 130 illustrated in FIGS. 3 and 4. Where two or more second semiconductor chips 130 are stacked on embedded COC package 100A, height T1 of solder balls 250 of additional semiconductor package 200A is increased correspondingly.

In some embodiments, at least one semiconductor chip, e.g., first semiconductor chip 120, is embedded in PCB 110 of embedded COC package 100A. As such, height T1 of solder balls 250 of additional semiconductor package 200A may be reduced to provide POP 300A with a stable structure.

Where two or more second semiconductor chips 130 are stacked on PCB 110, the size of solder balls 250 of semiconductor package 200A must be reduced because, in a reflow process for bonding solder balls 250 to the upper surface of PCB 110 of embedded COC package 100A, solder balls 250 are melted and spread and thus their size increases. As a result, neighboring solder balls 250 may contact each other, which can lead to a short circuit. To prevent this from occurring, the distance between solder balls 250 must be increased, which can restrict the number of solder balls 250 under additional semiconductor package 200A. However, where at least one first semiconductor chip 120 is embedded in a PCB 210 of embedded COC package 100A, so height T1 of solder balls 250 is reduced and the above problem can be avoided.

Semiconductor package 200A comprises PCB 210, a semiconductor chip 220 mounted on PCB 210 so that an active surface of semiconductor chip 220 faces upward, wires 230 for connecting bond pads of semiconductor chip 220 to bond fingers of PCB 210, an encapsulation resin 240 sealing semiconductor chip 220, an upper surface of PCB 210, and wires 230, and solder balls 250 bonded to a lower surface of PCB 210.

Referring to FIG. 7, the structure of POP 300B is similar to that of POP 300A, but the internal structure of semiconductor package 200B is different from that of semiconductor package 200A.

In particular, semiconductor package 200B comprises PCB 210, semiconductor chip 220 mounted on PCB 210 by using bumps 232, encapsulation resin 240 sealing semiconductor chip 220 and the upper surface of PCB 210, and solder balls 250 bonded to the lower surface of PCB 210. The features and advantages of POP 300B are similar to those of POP 300A and will not be further described here.

Referring to FIG. 8, when compared to FIG. 6, the structure of POP 300C is similar to that of POP 300A, but the internal structure of semiconductor package 200C is different from that of semiconductor package 200A.

In particular, additional semiconductor package 200C comprises PCB 210, a plurality of semiconductor chips 220A and 220B stacked on PCB 210, TSVs 234 formed in semiconductor chips 220A and 220B, encapsulation resin 240 sealing semiconductor chips 220A and 220B and the upper surface of PCB 210, and solder balls 250 bonded to the lower surface of PCB 210. The features and advantages of POP 300C are the similar to those of POP 300A and will not be further described here.

Figure 9:
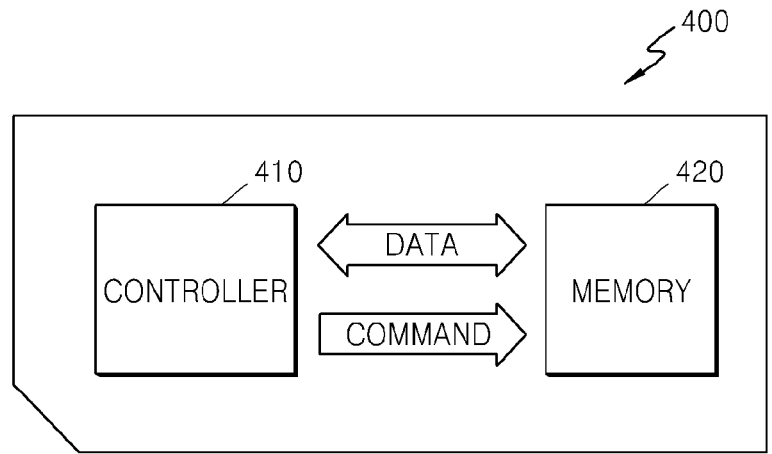
FIGS. 9 and 10 are block diagrams illustrating systems comprising semiconductor chips in semiconductor packages according to embodiments of the inventive concept.
Figure 10:
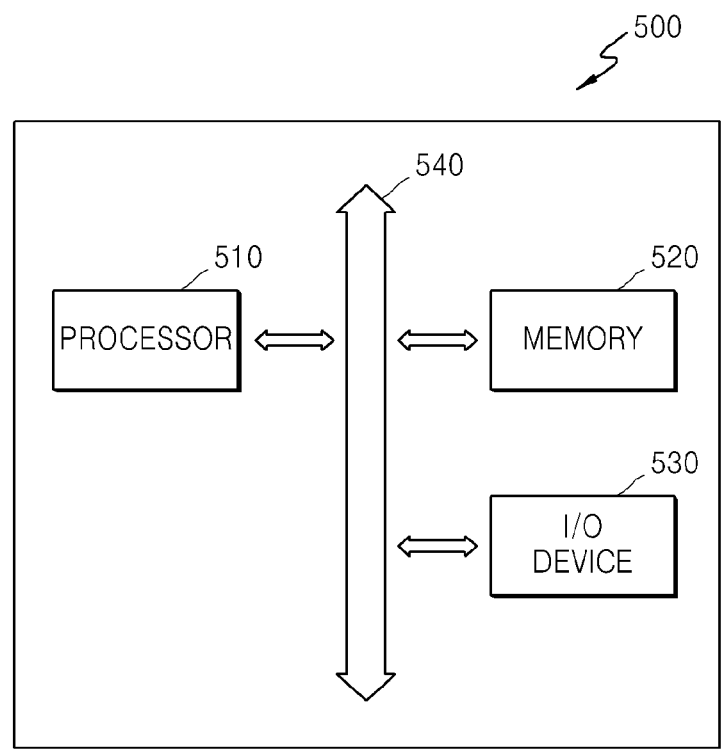

FIGS. 9 and 10 are block diagrams illustrating systems comprising semiconductor chips in semiconductor packages according to embodiments of the inventive concept.

FIG. 9 illustrates a system in which semiconductor chips used in embedded COC package 100A, 100B, or 100C are mounted on a PCB 400 of an electronic device.

Referring to FIG. 9, a controller 410 and a memory 420 are mounted on PCB 400 to exchange electrical signals. For example, controller 410 can transmit commands and memory 420 can transmit data. Memory 420 comprises semiconductor chips. PCB 400 can be used as a memory device such as a multi media card (MMC) or a secure digital card.

FIG. 10 illustrates a system 500 comprising an embedded COC semiconductor package.

Referring to FIG. 10, system 500 comprises a processor 510, an I/O device 530, and a memory 520 that exchange data via a bus 540. Processor 510 executes a program and controls system 500. I/O device 530 is used to input or output data of system 500. System 500 is connected to an external device such as a personal computer or a network to exchange data with the external device by using I/O device 530.

Memory 520 comprises semiconductor chips and stores code and data for operating processor 510. System 500 can be incorporated in any of several devices, such as a mobile phone, MP3 player, vehicle navigation system, solid state disk (SSDs), and various household applications.

A COC package and a POP according to embodiments of the inventive concept can be used in integrated semiconductor packages such as SIPs, and in various devices such as personal digital assistants (PDAs), mobile phones, MP3 players, vehicle navigation systems, SSDs, or household applications.

Although various embodiments of the inventive concept have been described herein, various changes in form and details can be made to the described embodiments without departing from the scope of the inventive concept as defined by the claims.

What is claimed is:

1. An embedded chip-on-chip (COC) package comprising:
a printed circuit board (PCB) having a top surface, a bottom surface, a recess in the top surface thereof, and a circuit pattern at the bottom of the recess, whereby the PCB comprises a recessed semiconductor chip mounting unit;
a first semiconductor chip disposed in the recess so as to be embedded in the recessed semiconductor chip mounting unit and electrically connected to the circuit pattern at the bottom of the recess;
a second semiconductor chip mounted to the recessed semiconductor chip mounting unit,
wherein the first semiconductor chip has an active surface that faces upwardly and a bottom surface that faces the circuit pattern at the bottom of the recess, the second semiconductor chip has an active surface that faces downwardly and towards both the active surface of the first semiconductor chip and a portion of the top surface of the PCB that extends around the recess, and the second semiconductor chip is electrically connected to the first semiconductor chip and to the PCB independently of each other; and
a third semiconductor chip having a footprint smaller than that of the second semiconductor chip and mounted on the second semiconductor chip, the third semiconductor chip having electrically conductive bumps by which the third semiconductor chip is electrically connected to the second semiconductor chip.

2. The COC package of claim 1, wherein the second semiconductor chip has electrically conductive bumps by which the second semiconductor chip is electrically connected to the first semiconductor chip.

3. The COC package of claim 1, wherein the first, second and third semiconductor chips have power terminals and ground terminals, and the first and second semiconductor chips have through silicon vias (TSVs) by which the power and ground terminals are electrically connected to the circuit pattern at the bottom of the recess.

4. The COC package of claim 1, further comprising an encapsulation resin sealing the second and third semiconductor chips and said portion of the top surface of the PCB extending around the recess.

5. The COC package of claim 1, further comprising solder balls bonded to the bottom surface of the PCB.

6. A package-on-package (POP), comprising:
an embedded chip-on-chip (COC) package comprising a printed circuit board (PCB) having a top surface, a bottom surface, a recess in the top surface thereof, and a circuit pattern at the bottom of the recess, whereby the PCB comprises a recessed semiconductor chip mounting unit, a first semiconductor chip disposed in the recess so as to be embedded in the recessed semiconductor chip mounting unit and electrically connected to the circuit pattern at the bottom of the recess, and a second semiconductor chip mounted to the recessed semiconductor chip mounting unit, wherein the first semiconductor chip has an active surface that faces upwardly and a bottom surface that faces the circuit pattern at the bottom of the recess, the second semiconductor chip has an active surface that faces downwardly and towards both the active surface of the first semiconductor chip and a portion of the top surface of the PCB that extends around the recess, and the second semiconductor chip is electrically connected to the first semiconductor chip and to the PCB independently of each other; and an additional semiconductor package comprising:

a second PCB having an upper surface and a lower surface, a plurality of additional semiconductor chips mounted on the second PCB, the additional semiconductor chips having through silicon vias (TSVs), an encapsulation resin sealing the plurality of semiconductor chips and the upper surface of the second PCB, and solder balls by which the additional semiconductor package is mounted and electrically connected to the PCB of the embedded COC package, said solder balls being bonded to the lower surface of the second PCB.

7. The POP of claim 6, wherein the height of the solder balls of the additional semiconductor package is greater than the thickness of the second semiconductor chip of the embedded COC package but less than twice the thickness of the second semiconductor chip of the embedded COC package.

8. The POP of claim 6, wherein the first and second semiconductor chips have power terminals and ground terminals, the PCB of the embedded COC package has electrically conductive bonding pads constituting the bottom surface thereof, and the first semiconductor chip has through silicon vias (TSVs) by which the power and ground terminals are electrically connected to the circuit pattern at the bottom of the recess.

* * * * *